(12) United States Patent
Compoint et al.

(10) Patent No.: US 11,485,115 B2
(45) Date of Patent: *Nov. 1, 2022

(54) LAMINATED GLAZING COMPRISING A STACK OF LAYERS

(71) Applicant: SAINT-GOBAIN GLASS FRANCE, Courbevoie (FR)

(72) Inventors: François Compoint, Saint-Pierre-des-Corps (FR); Marco De Grazia, Puteaux (FR); Cécile Dalle-Ferrier, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 117 days.

This patent is subject to a terminal disclaimer.

(21) Appl. No.: 16/498,968

(22) PCT Filed: Mar. 26, 2018

(86) PCT No.: PCT/FR2018/050721
§ 371 (c)(1),
(2) Date: Sep. 27, 2019

(87) PCT Pub. No.: WO2018/178547
PCT Pub. Date: Oct. 4, 2018

(65) Prior Publication Data
US 2020/0055285 A1 Feb. 20, 2020

(30) Foreign Application Priority Data
Mar. 29, 2017 (FR) ...................................... 1752605

(51) Int. Cl.
*B32B 17/10* (2006.01)
*C23C 14/35* (2006.01)
(52) U.S. Cl.
CPC .... *B32B 17/10651* (2013.01); *B32B 17/1022* (2013.01); *B32B 17/10036* (2013.01); *B32B 17/10871* (2013.01); *B32B 17/10908* (2013.01); *B32B 17/10935* (2013.01); *B32B 17/10972* (2013.01); *C23C 14/35* (2013.01)
(58) Field of Classification Search
CPC ...... B32B 17/10651; B32B 17/100036; B32B 17/1022; B32B 17/10871; B32B 17/10972; B32B 17/10036; B32B 17/10908; B32B 17/10935; B32B 17/10229; B32B 17/10706; B32B 17/10743; B32B 17/10761; C23C 14/35
See application file for complete search history.

(56) References Cited

U.S. PATENT DOCUMENTS

| 5,122,403 A * | 6/1992 | Roginski ........... B32B 17/10036 428/38 |
| 2006/0191625 A1* | 8/2006 | Kapp ................ B32B 17/10247 156/99 |
| 2008/0268214 A1 | 10/2008 | Hayes et al. |
| 2009/0176101 A1 | 7/2009 | Greenall et al. |
| 2011/0096555 A1* | 4/2011 | Pires ................. B32B 17/10761 362/363 |
| 2013/0059957 A1* | 3/2013 | Germroth ............... C08L 67/02 524/141 |
| 2014/0104689 A1* | 4/2014 | Padiyath ........... B32B 17/10174 359/592 |
| 2016/0194516 A1* | 7/2016 | Nadaud .................... C09D 5/20 428/336 |

FOREIGN PATENT DOCUMENTS

| EP | 1 060 876 A2 | 12/2000 |
| FR | 2 925 483 A1 | 6/2009 |
| FR | 2 999 978 A1 | 6/2014 |
| KR | 10-1671192 81 | 11/2016 |

OTHER PUBLICATIONS

International Search Report as issued in International Patent Application No. PCT/FR2018/050721, dated Jun. 6, 2018.

* cited by examiner

*Primary Examiner* — George R Koch
*Assistant Examiner* — Christopher C Caillouet
(74) *Attorney, Agent, or Firm* — Pillsbury Winthrop Shaw Pittman LLP

(57) ABSTRACT

A process for manufacturing a colored laminated glazing including first and second glass sheets, the two sheets being connected together by a thermoplastic interlayer, includes depositing a stack of layers including functional layer on a face of the first and/or of the second glass sheet, liquid deposition, on a face of the first and/or of the second glass sheet, of a polymer layer including a coloring agent and polymer compounds, drying and optionally curing of the polymer layer, assembling the glass sheet, coated with the colored polymer layer, with a colorless transparent thermoplastic interlayer and with the second glass sheet, so that the colored polymer layer is in direct contact with the interlayer, degassing, and heat treatment under pressure and/or under vacuum of the laminated glass at a temperature of between 100° C. and 200° C.

20 Claims, No Drawings

LAMINATED GLAZING COMPRISING A STACK OF LAYERS

CROSS REFERENCE TO RELATED APPLICATIONS

This application is the U.S. National Stage of PCT/FR2018/050721, filed Mar. 26, 2018, which in turn claims priority to French Patent Application No. 1752605 filed Mar. 29, 2017, the entire contents of all applications are incorporated herein by reference in their entireties.

The present invention relates to a process for manufacturing a laminated glazing, at least one of the glass sheets of which comprises a stack of functional thin layers, and also to the laminated glazing capable of being obtained by this process.

Laminated glazings are commonly used in the motor vehicle, aeronautical or construction fields, since they exhibit the advantage of being "safety" glazings. They consist of two glass sheets connected together by a thermoplastic interlayer Layer. It is known to use glass sheets bearing functional coatings that give the glazings optical, thermal or electrical properties. For solar control and/or low emissivity applications, the functional coatings are based on a stack of layers, of which some are functional, and others are dielectric layers. The functional layers, which are metal layers, give the stack the desired thermal and/or optical properties. The dielectric layers are generally made of transparent dielectric materials and have the essential role of imparting chemical and/or mechanical protection to the functional layers. The choice of the metal layers, of the protective layers, the relative thicknesses thereof and the way in which the stack is created makes it possible to give the glazing certain optical properties, for example in terms of light reflection, light transmission and solar factor. The esthetic appearance of the substrates coated with these stacks is often colored, the coloration and its intensity being dependent in particular on the stack deposited on the substrate. For certain applications, the coloration obtained is not the desired coloration, and it may be desirable to neutralize it or modify it slightly. The desire to modify the coloration exists particularly in laminated glazings when one of the constituent glass sheets of the glazing comprises a stack of thin layers which gives a certain tint which, during the lamination process, is sometimes slightly modified. In this precise case, the optimizations made to the stack in order to obtain the desired properties in terms of color are no longer valid when the stack is positioned on a constituent glass sheet of a glazing which has been laminated since the heat treatments to which the glazing is subjected during the lamination process make the coloration vary. For certain applications, it may be necessary to have to develop specific stacks for laminated glazings in order to prevent the variation in tint. However, this solution is expensive and complicated.

The aim is therefore to develop a process for manufacturing laminated glazings, of which at least one of the constituent glass sheets is coated with a functional coating that gives a certain coloration, which makes it possible to modify the coloration simply, by working on existing laminated glazing production lines, and the manufacturing costs of which are not very high. The present invention sits within this context, which invention provides a manufacturing process which makes it possible to modify the final coloration of the laminated glazing, while retaining the selectivity of the functional coating, and while guaranteeing low manufacturing costs and also a very good homogeneity of the coloration over the whole of the surface area of the glazing, even when the latter is large in size.

The process according to the present invention is a process for manufacturing a laminated glazing comprising at least two glass sheets, of which at least one of the glass sheets has one of its faces coated with at least one functional layer, the glass sheets being connected together by a transparent thermoplastic interlayer which is colorless before the final step of assembling the glazing, and which becomes colored during the manufacture of the glazing.

Said process for manufacturing the laminated glazing comprising at least a first and a second glass sheet, the two sheets being connected together by a thermoplastic interlayer, comprises the following steps:

deposition of a stack of layers comprising at least one functional layer on at least one face of the first and/or of the second glass sheet, liquid deposition, on at least one face of the first and/or of the second glass sheet, of a polymer layer comprising a coloring agent and polymer compounds, drying and optionally curing of the polymer layer, assembling the glass sheet, coated with the colored polymer layer, with a colorless transparent thermoplastic interlayer and with the other glass sheet, so that the colored polymer layer is in direct contact with said interlayer, degassing, during which the air trapped between the glass sheets and the thermoplastic interlayer is removed, and heat treatment under pressure and/or under vacuum of the laminated glass at a temperature of between 100° C. and 200° C., during which the coloring agent present in the polymer layer migrates toward the thermoplastic interlayer and during which the laminated glazing is assembled.

Advantageously, the process according to the present invention makes it possible to modify the coloration of a laminated glazing, owing to the migration of the coloring agent which takes place from the colored polymer layer toward the thermoplastic interlayer during the laminated glazing manufacturing process. The modification of the coloration is provided by the presence of a polymer layer, which is easy to apply by the liquid route and relatively inexpensive, on at least one of the inner faces of one of the constituent glass sheets of the laminated glazing. During the process for manufacturing the glazing, and in particular during the assembling of the various constituent parts of the glazing, a phenomenon of migration of the coloring agent takes place uniformly over the whole of the thickness of the polymer interlayer. The homogeneity of the coloration is thus guaranteed, even on large-sized substrates, using a process which is simple to carry out and which does not require modifying the conventional steps of the processes for manufacturing a laminated glazing (assembling of the various parts, degassing and heat treatment for the purpose of the final adhesive bonding). Surprisingly, this process makes it possible to obtain laminated glazings having a homogeneous coloration, without requiring an "optical" quality of the tinted polymer layer. The assembling and heat treatment phase corrects the coloration imperfections which may possibly exist in the colored polymer layer. Thus, the process according to the invention makes it possible to simply neutralize or modify the coloration induced by the stack of thin layers, without it being necessary to modify said stack so as to anticipate the tint modifications due to the heat treatments carried out during the assembly process.

Within the meaning of the present invention, the "inner face" of a glass sheet is understood to mean the face of the sheet which is, after assembling, in contact with the thermoplastic interlayer. The inner faces in a laminated glazing comprising two glass sheets are often known as face 2 and face 3, face 2 belonging to the first glass sheet and face 3 to the second glass sheet. In the process according to the present invention, the inner faces (or else face 2 or 3) are those on which the polymer layer is deposited. This layer can be deposited on one face of one of the two glass sheets constituting the laminated glazing or on one face of each of the glass sheets constituting the laminated glazing.

The stack of thin layers is deposited on the first and/or the second constituent glass sheet of the laminated glazing. Preferentially, the deposition that consists in depositing one or more functional layers on a transparent substrate is carried out on the faces of the glass sheets which, after assembly, will constitute the inner faces (face 2 and/or face 3) of the laminated glazing. The functional layer is for example a layer that can act on solar radiation and/or infrared radiation of long wavelength. These functional layers are metal layers based on silver, on an alloy comprising silver or on a metal chosen from niobium, tantalum, molybdenum and/or zirconium. The glass sheet on which the functional coating is deposited may comprise a stack of thin layers successively comprising an alternation of n functional metal layers and (n+1) antireflection coatings, each antireflection coating comprising at least one dielectric layer, so that each functional metal layer is positioned between two antireflection coatings. Preferably, n is equal to 1, 2, 3 or 4. More preferably still, n is greater than 1, in particular n is equal to 2 or 3. The dielectric layers are also deposited by magnetron sputtering. These layers of dielectrics are for example chosen from oxides, nitrides or oxynitrides of one or more elements chosen from titanium, silicon, aluminum, zirconium, hafnium, tin and zinc.

An example of a stack that can be deposited comprises:
  a dielectric coating located underneath the functional coating,
  a functional coating,
  a dielectric coating located on top of the functional coating,
  optionally a protective layer.

The thickness of the functional coating is generally greater than 100 nm, preferably greater than 150 nm and less than 300 nm, preferably less than 250 nm.

The functional coating may be deposited by any known means such as by magnetron sputtering, by thermal evaporation, by CVD or PECVD, by pyrolysis, by chemical deposition, by sol-gel deposition or wet deposition of inorganic layers. Preferably, in the process according to the invention, the functional coating is deposited by magnetron sputtering. In this advantageous embodiment, all the layers of the functional coating are deposited by magnetron sputtering.

The functional stack is in particular characterized by measurements of optical properties such as the light transmission LT, the exterior and/or interior light reflection, the a* and b* color components of the CIE Lab model for the representation of colors developed by the International Commission on Illumination, and the solar control performances, such as the solar factor and the selectivity. The solar factor, denoted by "g" is the ratio between the total energy passing through the glazing and the incident solar energy. The selectivity, denoted by "s", is the ratio between the light transmission and the solar factor.

The polymer layer is a layer that can be applied by the liquid route. The polymer can be dissolved in a solvent in order to make liquid deposition possible. Mention may be made, for example, of a polymer layer based on polyvinyl butyral, on polyethylene or on ethylene/vinyl acetate dissolved in a solvent. Any other polymer material that is chemically compatible with the thermoplastic interlayer placed between the two glass sheets may be used. Preferably, with the objective of using polymer formulations with as little solvent as possible for EHS aspects, the colored polymer layer is preferably a layer obtained from a composition comprising epoxide compounds or methacrylate compounds. The polymer layer is, for example, obtained from a liquid composition comprising (meth)acrylate compounds chosen from monomers, oligomers or polymers comprising at least one methacrylate function.

The liquid composition comprises at least one aliphatic urethane-acrylic oligomer, at least one monofunctional, bifunctional or trifunctional (meth)acrylate monomer, at least one polymerization initiator and at least one coloring agent. Preferably, the (meth)acrylate monomer is monofunctional or bifunctional and therefore it comprises at least two reactive sites. The relatively low functionality of the monomers used to polymerize the polymeric layer facilitates the migration of the coloring agent within the layer.

The liquid composition advantageously comprises, as percentage by weight with respect to the total weight of the (meth)acrylate compounds, from 30% to 80% by weight of at least one aliphatic urethane/acrylic oligomer and from 20% to 70% by weight of at least one monofunctional or bifunctional (meth)acrylate monomer. The coloring agent represents between 0.01% and 10% by weight, with respect to the total weight of the polymer compounds. The coloring agent is for example an organic compound. It is inserted into the polymer composition in the molecular state, that is to say that it is dissolved in the composition and does not form solid particles. Very advantageously, the coloring agent has acid/base properties which make it possible to increase its affinity with the thermoplastic interlayer. Thus, by way of example, the coloring agent is an organic compound of Lewis acid type and the thermoplastic interlayer is a base, which makes it possible to promote the migration of the coloring agent from the polymer layer toward the thermoplastic interlayer. Mention may be made, for example, as coloring agent, of derivatives of the family of anthraquinones (Acid Blue 25, Alizarin, Anthrapurpurin, Carminic acid, 1,4-Diamino-2,3-dihydroanthraquinone, 7,14-Dibenzpyrenequinone, Dibromoanthanthrone, 1,3-Dihydroxyanthraquinone, 1,4-Dihydroxyanthraquinone, Disperse Red 9, Disperse Red 11, Indanthrone Blue, Morindone, Oil Blue 35, Oil Blue A, Parietin, Quinizarine Green SS, Remazol Brilliant Blue R, Solvent Violet 13, 1,2,4-Trihydroxyanthraquinone, Vat Orange 1, Vat Yellow 1) or products of the Neozapon®, Irgasperse®, Basantol® and Orasol® ranges, sold by BASF.

The polymer layer may comprise, in its composition, an adhesion promoter, such as, for example, a silane or any other adhesion-promoting compound based on a metal, such as titanium, zirconium, tin or aluminum.

The polymer layer is deposited, on one face of at least one of the glass sheets, by application, at ambient temperature, of said liquid composition by roll coating, by flow coating, by dip coating, by curtain coating or by spray coating. Preferably, the liquid composition is applied by roll coating or by curtain coating.

The polymer layer is deposited on at least one of the faces 2 or 3 of the glass sheets, that is to say on one of the faces which are in contact with the thermoplastic interlayer. The polymer layer may be deposited on the functional coating.

After having been deposited on one of the faces of at least one glass sheet, the polymer layer is dried and/or cured at a temperature below 200° C. If the polymer layer deposited contains a solvent, the latter will be evaporated during the drying step. The polymeric layer can also be cured during this step, which entails a curing/crosslinking, for example by UV radiation or by an electron beam.

The thickness of the cured polymer layer is between 1 and 200 μm.

The step of depositing the polymer layer can be carried out directly on the laminated glazing production line and then constitutes the first step during the factory production of the laminated glazing. The deposition step can also be carried out on a production line other than that of the laminated glazing. In this case, the glass sheet or sheets coated with the polymer layer arrive on the line for assembling the laminated glazings with the dried and/or cured polymer coating.

The glass sheet, thus coated with the polymer layer, is subsequently assembled with the thermoplastic interlayer and with a second glass sheet in order to form the laminated glazing. The second glass sheet may also comprise, on the face intended to be the inner face, a polymer layer that is identical to the one deposited on the first glass sheet, or a polymer layer that is slightly different, in particular in terms of coloration.

According to one embodiment, a first glass sheet comprising, on its face 2, the functional coating and the polymer layer is assembled with the transparent thermoplastic interlayer and a second glass sheet. This second glass sheet may optionally comprise, on its face 3, a polymer layer and/or a functional coating.

According to another embodiment, a first glass sheet comprising, on its face 2, the functional coating is assembled with the thermoplastic interlayer and with a second glass sheet on which the polymer layer has been deposited. This second glass sheet may optionally comprise a functional coating.

In order to improve the adhesion between the various elements constituting the laminated glazing, namely between the glass sheets and the thermoplastic interlayer, the process according to the invention may comprise a step of treating the surface of the glass sheet on which the colored polymer layer is deposited and/or the surface of the face of the thermoplastic interlayer in contact with the polymer layer, with an adhesion promoter.

The thermoplastic interlayer is polyvinyl butyral, polyethylene, ethylene/vinyl acetate or any other thermoplastic material. The interlayer may be composed of several layers combined together, the underlayer in contact with the polymeric layer being an underlayer of organic nature.

The process according to the invention advantageously makes it possible to prepare colored laminated glasses without requiring modification of the laminated glazing assembly phases. From the moment when the constituent glass sheets of the laminated glazing are coated with the colored polymer layer, they are assembled with the thermoplastic interlayer in the normal way by a heat treatment at a temperature of between 100° C. and 200° C., under vacuum and/or under pressure. This heat treatment can, for example, be carried out in an autoclave at a temperature of between 135° C. and 145° C., under a pressure of between 5 and 14 bar.

The invention also relates to a laminated glazing capable of being obtained by the process described above. This glazing can be used in the field of construction, having a decorative use in particular, or else as motor vehicle glazing. The laminated glazings obtained have the desired mechanical strength for this type of application and can be considered as safety glazings.

The following example illustrates the invention without limiting the scope thereof.

Two flat glass sheets with a thickness of around 6 mm, obtained by a float process, are used to manufacture a laminated glazing according to the present invention.

A functional coating, comprising the stack of thin layers deposited by a magnetron sputtering device, is deposited on one face of a first glass sheet. The stack of thin layers successively comprises, starting from the glass sheet, an alternation of three dielectric coatings and of two silver layers (functional metal layers), each dielectric coating comprising at least one dielectric layer, so that each functional metal layer is positioned between two dielectric coatings. The layer of the functional coating furthest from the glass sheet is a 1 to 5 nm layer of titanium zirconium nitride. The total thickness of this functional coating is between 150 and 200 nm.

A liquid composition comprising an acrylate oligomer of Sartomer CN9002 (bifunctional aliphatic urethane/acrylate oligomer), CN131B (aromatic monoacrylate monomer) or SR610 (polyethylene glycol acrylate oligomer) type and SR 410 monomer (monofunctional aromatic acrylic monomer) is prepared with a 50/50 weight ratio. A coloring agent of anthraquinone type is added to the acrylate formulation in an amount of 0.13% by weight with respect to the total weight of the liquid acrylate composition. 5% by weight of a photoinitiator of Speedcure 500 type is added to the preceding mixture so as to enable the initiation of the polymerization. The liquid composition thus obtained is deposited by the liquid route by mechanical coating with a bar coater on the stack of functional layers described above. The wet polymer layer has a thickness of 30 μm. It is cured by UV irradiation. The thickness of the dry colored layer is around 20 μm.

A colorless PVB interlayer is placed on the colored polymer layer and the second glass sheet is placed on the interlayer so as to close up the laminated glazing. The combination is placed in an autoclave for 45 minutes at 140° C. under a pressure of 10 bar.

On removing from the autoclave, a transparent laminated glazing is obtained where the color of the stack of layers has been modified.

The optical and colorimetric characteristics of a laminated glazing without a polymer layer (reference) and of the laminated glazing with the polymer layer as obtained previously are given in the table below.

The light transmission LT is given in % and is measured under the illuminant D65 with 2° observer. The coordinates a*T and b*T indicate the a* and b* colors in transmission in the L*a*b* system measured under the illuminant D65 with 2° observer, perpendicularly to the glazing. The exterior light reflection corresponds to the light reflection in the visible range, given as a percentage and measured under the illuminant D65 with 2° observer, on the side of the outermost face, i.e. face 1 since the stack is positioned on face 2. The color coordinates a*R and b*R indicate the a* and b* colors in reflection in the L*a*b* system measured under the illuminant D65 with 2° observer, perpendicularly to the glazing. a*Rext and b*Rext will denote the colors measured on the side of the outermost face and a*Rint and b*Rint will denote the colors measured on the innermost face, i.e. face 4 since the stack is positioned on face 2.

| | g | LT | a*T | b*T | Rext | a*ext | b*ext | Rint | a*int | b*int | Selectivity |
|---|---|---|---|---|---|---|---|---|---|---|---|
| Stack alone | 31.5 | 51.2 | −12 | −0.1 | 25.6 | 14.6 | −6.4 | 18.4 | −5.5 | −20.2 | 1.6 |
| Stack with the polymer layer | 30.6 | 45.5 | −7.3 | 0.3 | 21.8 | 17.4 | −1.3 | 18.4 | −5.5 | −20 | 1.5 |

On the glazing according to the invention, i.e. with the polymer layer, the color modifications are significant in terms of a*T (level on the green-red axis of transmitted light) and b*ext (level on the blue-yellow axis of exterior reflected light) while retaining a good selective absorption capacity (selectivity) of IR radiation and a transmission close to 50%.

The invention claimed is:

1. A process for manufacturing a colored laminated glazing comprising at least a first and a second glass sheet, the first and second glass sheets being connected together by a thermoplastic interlayer, the process comprising:
   depositing a stack of layers comprising at least one functional layer on at least one face of the first and/or of the second glass sheet,
   liquid depositing, on at least one face of the first glass sheet, a colored polymer layer comprising a coloring agent and polymer compounds, wherein said coloring agent comprises an anthraquinone,
   drying and optionally curing the colored polymer layer,
   assembling the first glass sheet, coated with the colored polymer layer, with a colorless transparent thermoplastic interlayer and with the second glass sheet to form the laminated glazing, so that the colored polymer layer is in direct contact with said colorless transparent thermoplastic interlayer,
   degassing, during which the air trapped between the first and second glass sheets and the thermoplastic interlayer is removed, and
   laminating an assembly that comprises the first and second glass sheets, the stack of layers, the colored polymer layer and the colorless transparent thermoplastic interlayer by performing a heat treatment under pressure and/or under vacuum of the assembly at a temperature of between 100° C. and 200° C. during which the colored laminated glazing is assembled, the polymer compounds of the colored polymer layer being selected such that during said laminating the coloring agent present in the colored polymer layer migrates toward the thermoplastic interlayer.

2. The process as claimed in claim 1, wherein the depositing of the stack of layers is carried out by magnetron sputtering.

3. The process as claimed in claim 1, wherein the depositing of the colored polymer layer is carried out on the stack of layers.

4. The process as claimed in claim 1, wherein the colored polymer layer is a layer obtained by curing a composition comprising epoxide compounds or methacrylate compounds.

5. The process as claimed in claim 1, wherein the colored polymer layer is obtained from a liquid composition comprising (meth)acrylate compounds chosen from monomers, oligomers, or polymers comprising at least one methacrylate function.

6. The process as claimed in claim 5, wherein the liquid composition comprises, as percentage by weight with respect to the total weight of the (meth)acrylate compounds, from 30% to 80% by weight of at least one aliphatic urethane-acrylic oligomer and from 20% to 70% by weight of at least one monofunctional or bifunctional (meth)acrylate monomer.

7. The process as claimed in claim 1, wherein the coloring agent represents between 0.01% and 10% by weight, with respect to the total weight of the polymer compounds.

8. The process as claimed in claim 1, wherein the colored polymer layer comprises an adhesion promoter.

9. The process as claimed in claim 1, wherein the colored polymer layer is deposited by application, at ambient temperature, of a liquid composition, by roll coating, by flow coating, by dip coating, by curtain coating or by spray coating.

10. The process as claimed in claim 9, wherein the liquid composition is applied by roll coating or by curtain coating.

11. The process as claimed in claim 1, wherein the colored polymer layer is cured by drying at a temperature below 200° C., by UV crosslinking or by an electron beam.

12. The process as claimed in claim 1, wherein a thickness of the cured and dried colored polymer layer is between 1 and 200 μm.

13. The process as claimed in claim 1, further comprising treating the surface of the first glass sheet on which the colored polymer layer is deposited and/or the surface of the face of the thermoplastic interlayer in contact with the colored polymer layer, with an adhesion promoter.

14. The process as claimed in claim 1, wherein the thermoplastic interlayer is polyvinyl butyral, polyethylene or ethylene/vinyl acetate.

15. A laminated glazing capable of being obtained by the process as claimed in claim 1.

16. A process for manufacturing a colored laminated glazing comprising at least a first and a second glass sheet, the first and second glass sheets being connected together by a thermoplastic interlayer, the process comprising:
   depositing a stack of layers comprising at least one functional layer on at least one face of the first and/or of the second glass sheet,
   liquid depositing, on at least one face of the first glass sheet, a colored polymer layer comprising a coloring agent and polymer compounds, wherein said coloring agent comprises an anthraquinone,
   drying and optionally curing the colored polymer layer,
   assembling the first glass sheet, coated with the colored polymer layer, with a colorless transparent thermoplastic interlayer and with the second glass sheet to form the laminated glazing, so that the colored polymer layer is in direct contact with said colorless transparent thermoplastic interlayer,
   degassing, during which the air trapped between the first and second glass sheets and the thermoplastic interlayer is removed, and
   laminating an assembly that comprises the first and second glass sheets, the stack of layers, the colored polymer layer and the colorless transparent thermoplastic interlayer by performing a heat treatment under pressure and/or under vacuum of the assembly at a temperature of between 100° C. and 200° C. during which the colored laminated glazing is assembled, the polymer compounds of the colored polymer layer being selected such that during said laminating the coloring agent present in the colored polymer layer migrates toward the thermoplastic interlayer, wherein the colored polymer layer is obtained from a liquid composition that comprises at least one aliphatic urethane-acrylic oligomer, at least one monofunctional, bifunctional or trifunctional (meth)acrylate monomer, at least one polymerization initiator and said coloring agent.

17. The process as claimed in claim 16, wherein the depositing of the stack of layers is carried out by magnetron sputtering.

18. The process as claimed in claim 16, wherein the depositing of the colored polymer layer is carried out on the stack of layers.

19. A process for manufacturing a colored laminated glazing comprising at least a first and a second glass sheet, the first and second glass sheets being connected together by a thermoplastic interlayer, the process comprising:
   depositing a stack of layers comprising at least one functional layer on at least one face of the first and/or of the second glass sheet,
   liquid depositing, on at least one face of the first glass sheet, a colored polymer layer comprising a coloring agent and polymer compounds, wherein the colored polymer layer is obtained from a liquid composition that comprises at least one aliphatic urethane-acrylic oligomer, at least one monofunctional, bifunctional or trifunctional (meth)acrylate monomer, and at least one polymerization initiator, and wherein the coloring agent comprises an anthraquinone and represents between 0.01% and 10% by weight, with respect to the total weight of the polymer compounds,
   drying and optionally curing the colored polymer layer,
   assembling the first glass sheet, coated with the colored polymer layer, with a colorless transparent thermoplastic interlayer and with the second glass sheet to form the laminated glazing, so that the colored polymer layer is in direct contact with said interlayer,
   degassing, during which the air trapped between the first and second glass sheets and the thermoplastic interlayer is removed, and
   laminating an assembly that comprises the first and second glass sheets, the stack of layers, the colored polymer layer and the colorless transparent thermoplastic interlayer by performing a heat treatment under pressure and/or under vacuum of the assembly at a temperature of between 100° C. and 200° C. during which the colored laminated glazing is assembled, the polymer compounds of the colored polymer layer being selected such that during said laminating the coloring agent present in the colored polymer layer migrates toward the thermoplastic interlayer.

20. The process as claimed in claim 19, wherein the depositing of the colored polymer layer is carried out on the stack of layers.

* * * * *